(12) United States Patent
Lee et al.

(10) Patent No.: US 11,251,279 B2
(45) Date of Patent: Feb. 15, 2022

(54) HIGH VOLTAGE TRANSISTOR STRUCTURE AND METHOD OF FABRICATING THE SAME

(71) Applicant: UNITED MICROELECTRONICS CORP., Hsin-Chu (TW)

(72) Inventors: Zhi-Cheng Lee, Tainan (TW); Kai-Lin Lee, Kinmen County (TW); Wei-Jen Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/936,442

(22) Filed: Jul. 23, 2020

(65) Prior Publication Data
US 2022/0013648 A1    Jan. 13, 2022

(30) Foreign Application Priority Data
Jul. 8, 2020  (CN) .......................... 202010650267.0

(51) Int. Cl.
*H01L 29/423* (2006.01)
*H01L 29/40* (2006.01)
*H01L 29/49* (2006.01)
*H01L 29/66* (2006.01)

(52) U.S. Cl.
CPC ...... *H01L 29/42376* (2013.01); *H01L 29/401* (2013.01); *H01L 29/4983* (2013.01); *H01L 29/66545* (2013.01); *H01L 29/66553* (2013.01); *H01L 29/4966* (2013.01)

(58) Field of Classification Search
CPC ............. H01L 29/42376; H01L 29/401; H01L 29/4983; H01L 29/66545; H01L 29/66553; H01L 29/4966
See application file for complete search history.

(56) References Cited

U.S. PATENT DOCUMENTS

| | | | |
|---|---|---|---|
| 8,828,838 B2 | 9/2014 | Chuang | |
| 9,985,129 B2 | 5/2018 | Hsiao | |
| 10,096,596 B2 * | 10/2018 | Fang | ................. H01L 21/32139 |
| 2020/0058705 A1 * | 2/2020 | Sharma | ........... H01L 21/823828 |

* cited by examiner

*Primary Examiner* — Zandra V Smith
*Assistant Examiner* — Andre C Stevenson
(74) *Attorney, Agent, or Firm* — Winston Hsu

(57) ABSTRACT

A high voltage transistor structure includes a substrate. A metal gate is disposed on the substrate. At least one insulating material structure penetrates the metal gate. A metal compound layer is disposed between the metal gate and the substrate, between the insulating material structure and the substrate. The metal compound layer is a continuous structure. A gate dielectric layer is disposed under the metal compound layer and contacts the substrate.

9 Claims, 5 Drawing Sheets

HIGH VOLTAGE TRANSISTOR STRUCTURE AND METHOD OF FABRICATING THE SAME

BACKGROUND OF THE INVENTION

1. Field of the Invention

The present invention relates to a high voltage transistor structure and a method of fabricating the same, and more particularly to a high voltage transistor structure with an insulating material structure penetrating a metal gate and a method of fabricating the same.

2. Description of the Prior Art

Modern integrated circuit chips contain millions or even billions of semiconductor devices formed on a semiconductor substrate. Integrated circuit chips can use many different types of transistor devices, depending on the application of the integrated circuit chip. In recent years, the market for portable devices and radio frequency devices has gradually expanded, resulting in a significant increase in the use of high-voltage transistor devices. For example, high-voltage transistor devices are often used as power amplifiers in radio frequency transmission/reception chains because they have high breakdown voltage such as greater than about 50V at high frequencies.

Since the high-voltage transistor usually uses a metal gate, and the gate area of the high-voltage transistor is large, when forming the metal gate, dishing is easily occurred on the upper surface of the metal gate because of over-polishing.

SUMMARY OF THE INVENTION

According to a preferred embodiment of the present invention, a high voltage transistor structure includes a substrate. A metal gate is disposed on the substrate. At least one insulating material structure penetrates the metal gate. A metal compound layer is disposed between the metal gate and the substrate and between the insulating material structure and the substrate, wherein the metal compound layer is a first continuous structure. A gate dielectric layer is disposed under the metal compound layer and contacts the substrate.

A fabricating method of a high voltage transistor structure includes providing a substrate. Then, a gate dielectric layer, a metal compound layer and a dummy gate material layer are formed in sequence to cover the substrate. Later, the dummy gate material layer is patterned to form a dummy gate and at least one hole which penetrates the dummy gate by taking the metal compound layer as a stop layer. After that, an insulating material layer is formed to cover the dummy gate and the metal compound layer. The insulating material layer fills in the hole, wherein the insulating material layer filling in the hole forms at least one insulating material structure. Subsequently, the insulating material layer is planarized to expose a top surface of the dummy gate. Later, the dummy gate is removed to form a trench. Finally, a metal gate is formed to fill in the trench. The metal gate surrounds the insulating material structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of a high voltage transistor structure, wherein:

FIG. 2 and FIG. 3 are fabricating stages following FIG. 1, wherein FIG. 3 shows a sectional view taken along line AA' in FIG. 2;

FIG. 4 is a fabricating stage following FIG. 3;

FIG. 5 is a fabricating stage following FIG. 4;

FIG. 6 is a fabricating stage following FIG. 5; and

FIG. 7 and FIG. 8 are fabricating stages following FIG. 6, wherein FIG. 8 shows a sectional view taken along line BB' in FIG. 7.

DETAILED DESCRIPTION

Figure 7:
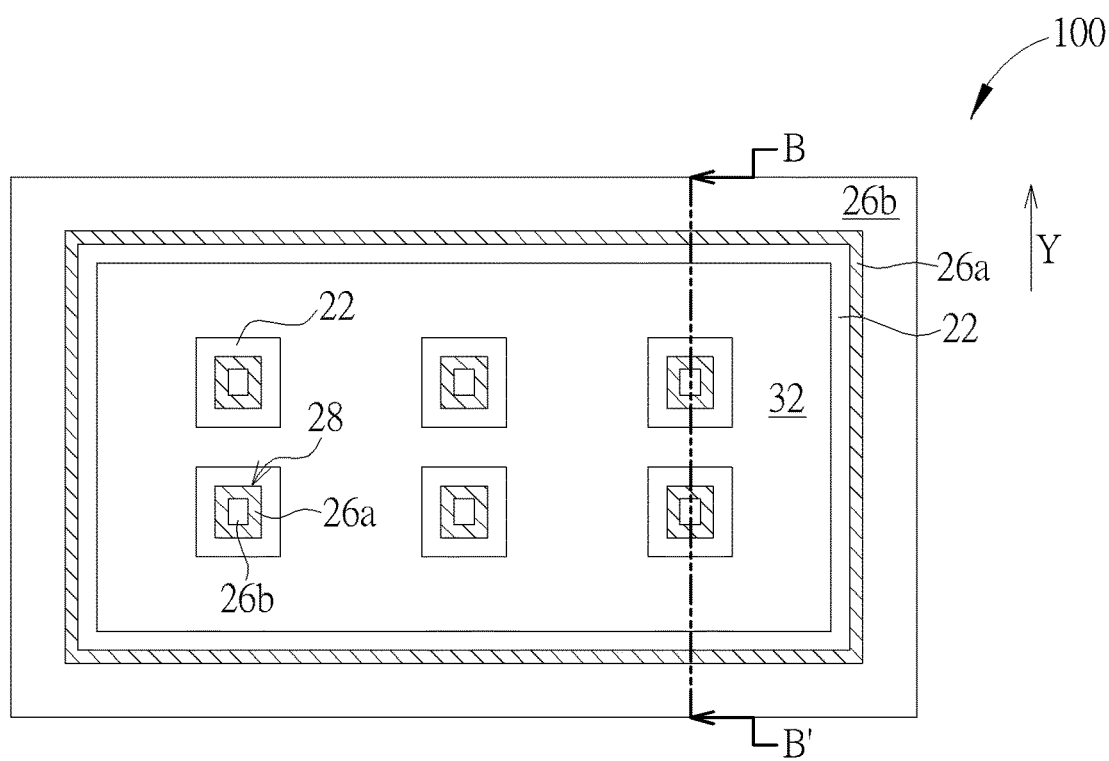
Figure 8:
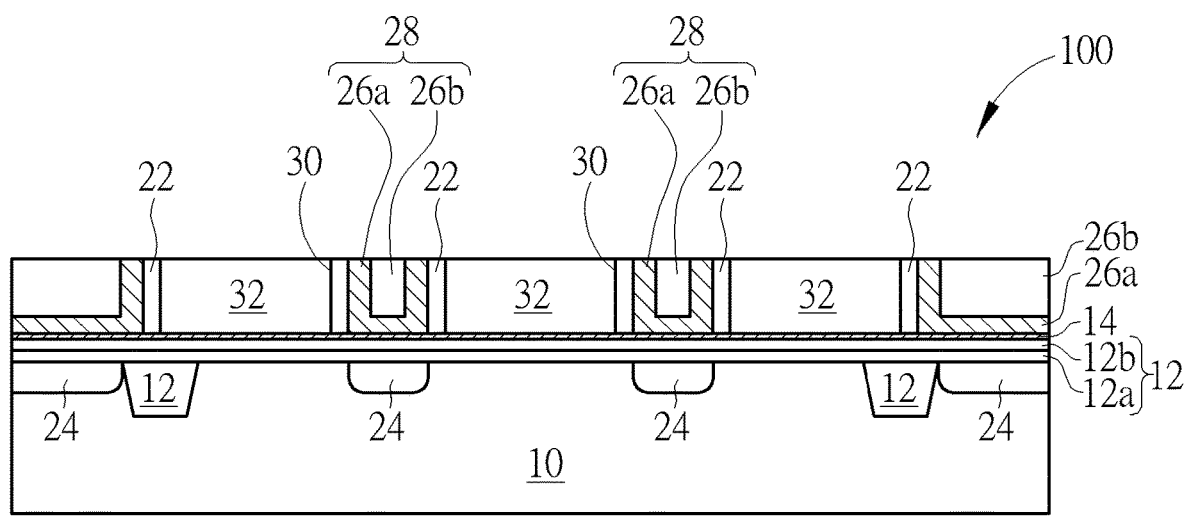
Figure 9:
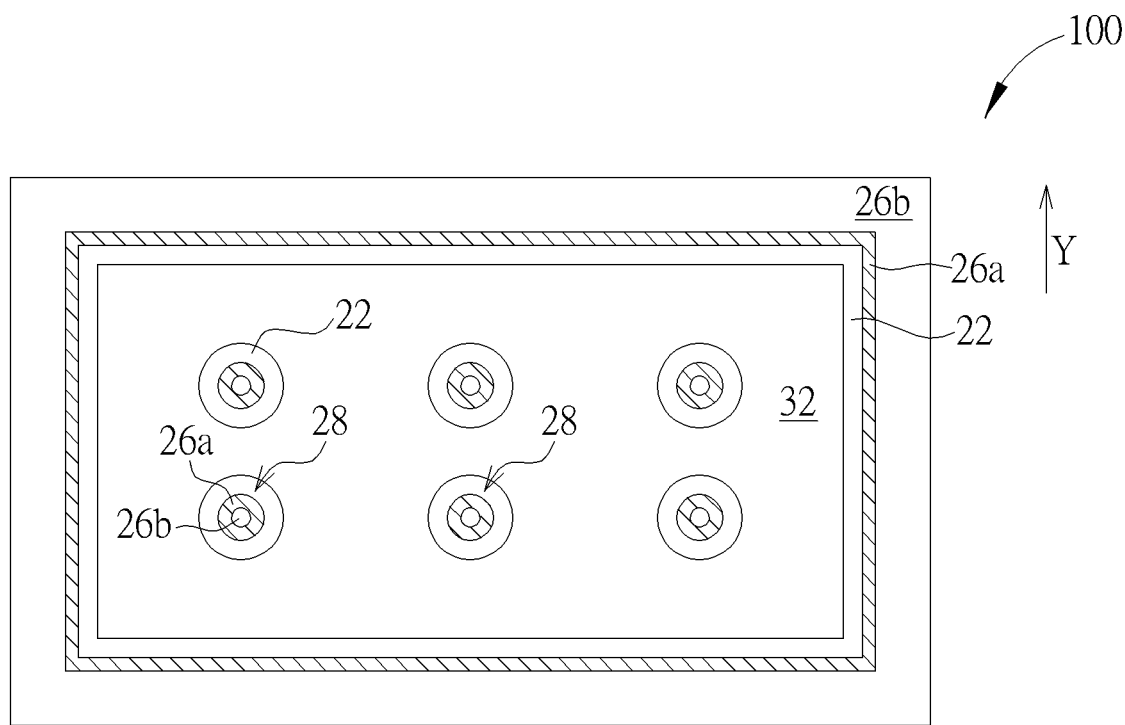
FIG. 9 depicts a modified type of an insulating material structure according to a preferred embodiment of the present invention.
Figure 10:
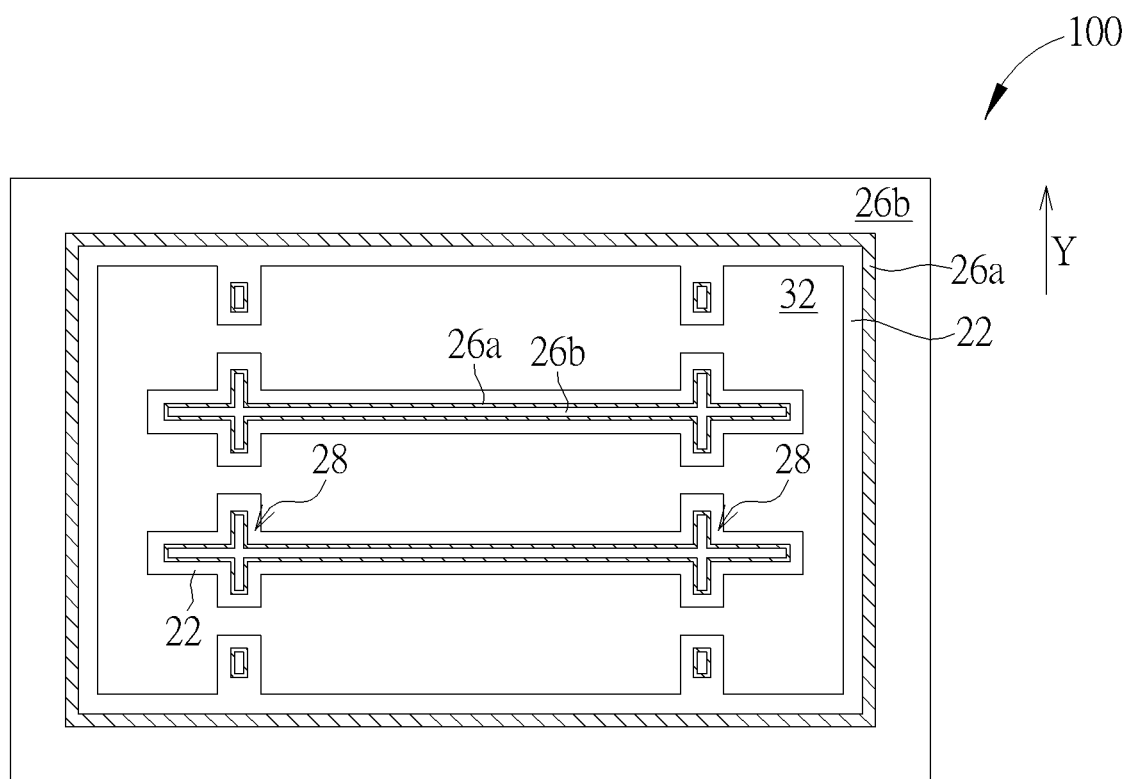
FIG. 10 depicts another modified type of an insulating material structure according to another preferred embodiment of the present invention.

FIG. 1 to FIG. 8 depict a fabricating method of a high voltage transistor structure. FIG. 9 depicts a modified type of an insulating material structure according to a preferred embodiment of the present invention. FIG. 10 depicts another modified type of an insulating material structure according to another preferred embodiment of the present invention.

Figure 1:
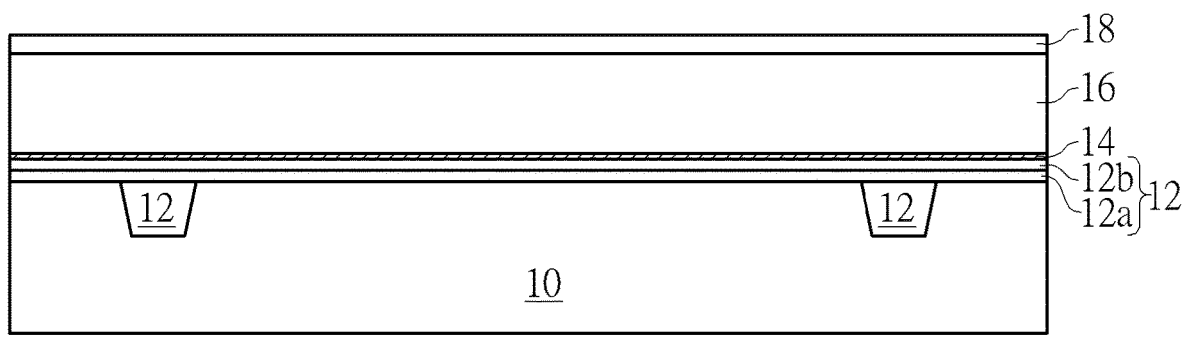

As shown in FIG. 1, a fabricating method of a high voltage transistor structure includes providing a substrate 10. At least one shallow trench isolation (STI) 12 is embedded within the substrate 10. Then, a gate dielectric layer 12, a metal compound layer 14, a dummy gate material layer 16 and a mask layer 18 are formed to cover the substrate 10. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The gate dielectric layer 12 may include numerous stacked dielectric material layers. For example, the gate dielectric layer 12 includes silicon oxide, silicon oxynitride (SiON), silicon nitride, tantalum oxide ($Ta_2O_5$), aluminum oxide ($Al_2O_5$), hafnium oxide ($HfO_2$), nitrogen-containing material, hafnium containing material, tantalum-containing material, aluminum containing material or high-k dielectrics having a dielectric constant greater than 5, or any combination thereof. For instance, the gate dielectric layer 12 may be formed of a layer of $HfO_2$ 12b stacked on a layer of silicon oxide 12a. The metal compound layer 14 includes metal oxide or metal nitride, such as tantalum nitride, titanium nitride, tantalum oxide or titanium oxide. According to a preferred embodiment of the present invention, the metal compound layer 14 is titanium nitride. The dummy gate material layer 16 may be polysilicon. The mask layer 18 may be silicon nitride, silicon oxide or silicon oxynitride.

Figure 2:
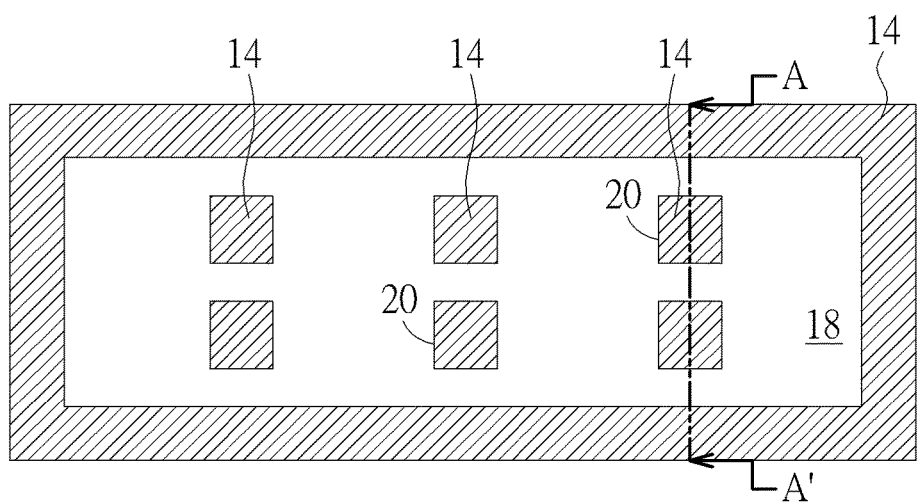
Figure 3:
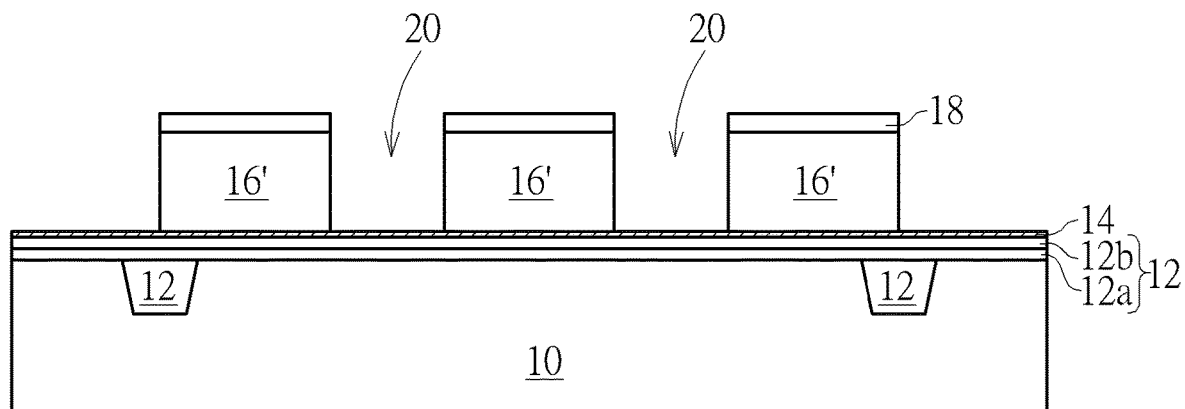

FIG. 2 and FIG. 3 are fabricating stages following FIG. 1, wherein FIG. 3 shows a sectional view taken along line AA' in FIG. 2. The dummy gate material layer 16 is patterned to form a dummy gate 16' and at least one hole 20 which penetrates the dummy gate 16' by taking the metal compound layer 14 as a stop layer. In this embodiment, numerous holes 20 are shown as an example, however there can be only one hole 20 according to a different embodiment. Because the mask layer 18 and the dummy gate 16' are entirely overlapped, the mask layer 18 and the dummy gate 16' are at the same position. As shown in FIG. 2, the dummy gate 16' is a continuous structure. In details, the steps of forming the dummy gate 16' includes patterning the mask layer 18 by a photomask (not shown) first. Later, the dummy gate material layer 16 is etched to form the dummy gate 16' and the holes 20 by using the mask layer 18 as a mask and the metal compound layer 14 as a stop layer. It is noteworthy that because the metal compound layer 14 serves as the stop layer, the metal compound layer 14 is still a continuous structure after forming the dummy gate 16'. In other words, the metal compound layer 14 is not only under the dummy gate 16' but also at the bottom of the holes 20 and be exposed from the holes 20.

Figure 4:
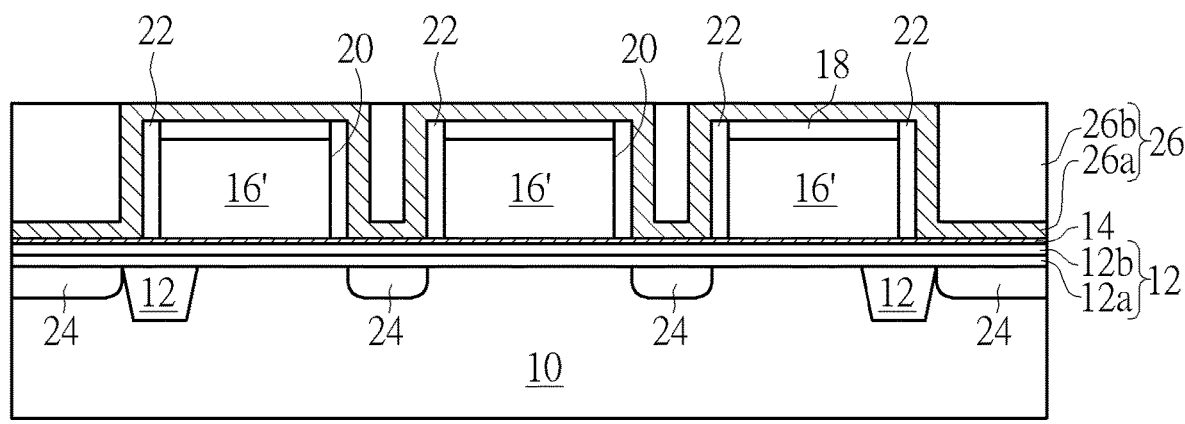
Figure 5:
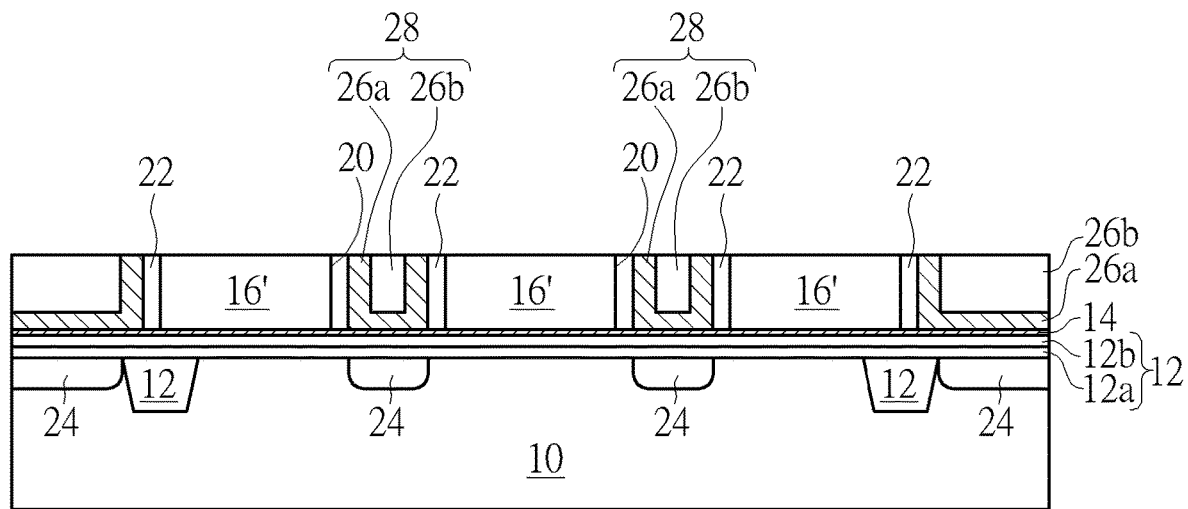

As shown in FIG. 4, numerous spacers 22 are formed to cover the sidewall of the dummy gate 16' and the side wall of the holes 20. Later, an ion implantation process is performed to implant ions and form doping regions 24 by taking the spacers 22 and the mask layer 18 as a mask. Doping regions 24 are respectively formed in the substrate 10 at two sides of the dummy gate 16' and directly under the holes 20. The doping regions 24 at two side of the dummy gate 16' serve as source/drain doping regions. Based on different requirements, the dopants in the doping regions 24 can be P-type dopants or N-type dopants. Next, an insulating material layer 26 is formed to cover the dummy gate 16' and the metal compound 14 and fills in the holes 20. More specifically speaking, the insulating material layer 26 may include an etch stop layer 20a and an interlayer dielectric 26b. The etch stop layer 20a is preferably silicon nitride. The interlayer dielectric 26b is preferably silicon oxide. The detailed steps of forming the insulating material layer 26 includes forming an etch stop layer 26a conformally covering the metal compound layer 14, the dummy gate 16' and filling in the holes 20. Later, an interlayer dielectric 20b is formed to cover the etch stop layer 26a and fills in the holes 20. After that, the interlayer dielectric 20b is planarized by a chemical mechanical polishing process and taking the etch stop layer 26a as a stop layer to make a top surface of the interlayer dielectric 26b and a top surface of the etch stop layer 26a aligned. As shown in FIG. 5, continuing to perform the planarization by planarizing the interlayer dielectric 20b, the etch stop layer 26a, the mask layer 18 and the spacers 22 until the dummy gate 16' is exposed. Now, the insulating material layer 26 (including the etch stop layer 26a and the interlayer dielectric 20b) in each of the holes 20 form an insulating material structure 28. Because there are numerous holes 20 in this embodiment, there are numerous insulating material structures 28. The insulating material structures 28 include silicon nitride, silicon oxide, silicon oxide-silicon nitride-silicon oxide (ONO), silicon carbon nitride (SiCN), silicon oxynitride (SiON) or silicon oxycarbonitride (SiOCN).

Figure 6:
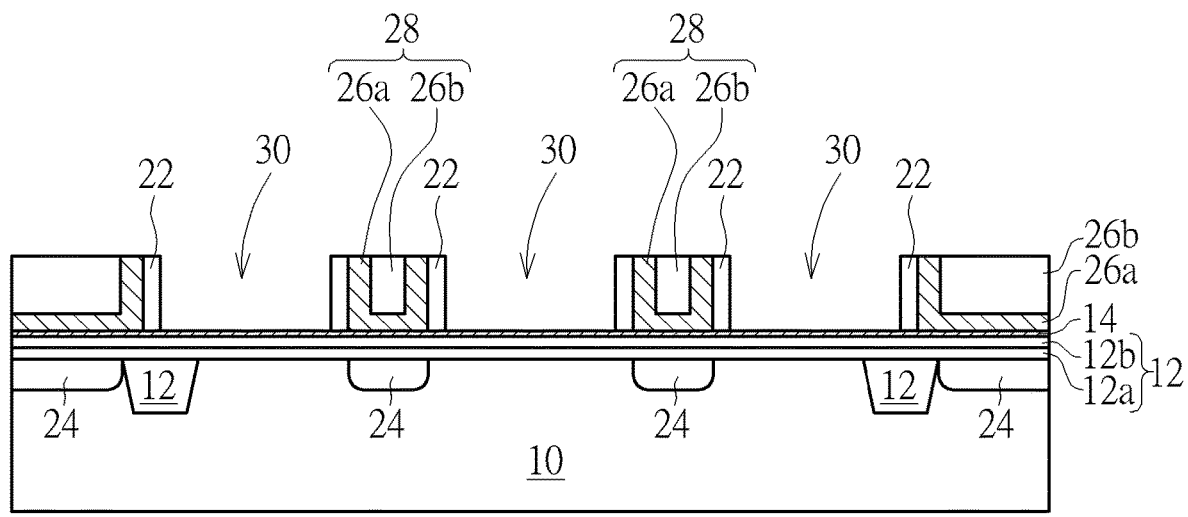

As shown in FIG. 6, the dummy gate 16' is removed to form at least one trench 30. In this embodiment, there are three trenches 30 shown as an example. Moreover, while removing the dummy gate 16', the insulating material structures 28 are not removed. FIG. 7 and FIG. 8 are fabricating stages following FIG. 6, wherein FIG. 8 shows a sectional view taken along line BB' in FIG. 7. Please refer to FIG. 7 and FIG. 8, a metal gate material layer (not shown) is formed to cover and fill in the trench 30. Later, a planarization process is performed to remove the metal gate material layer outside of the trenches 30. In other words, the planarization process is performed by taking the interlayer dielectric 20b as a stop layer. The metal gate material layer remained in the trenches 30 serves as a metal gate 32. The metal gate 32 surrounds the insulating material structure 28. Now, a high voltage transistor structure 100 of the present invention is completed. The metal gate 32 includes a metal layer and a work function layer. The metal layer is preferably a single layer of metal or a composite metal layers. The metal is preferred to have a good trench filling ability. The metal layer includes Al, Ti, Ta, W, Nb, Mo, Cu, TiN, TiC, TaN, Ti/W or Ti/TiN. The work function layer may be a P-type work function layer or an N-type work function layer. In one embodiment, the P-type work function layer includes TiN, TiC, TaN, TaC, WC or TiAlN. The N-type work function layer includes TiAl, ZrAl, WAl, or HfAl.

Moreover, the planarization process is preferably a chemical mechanical polishing process. However, because the metal gate 32 of the high voltage transistor structure 100 has a large area, a dishing is easily occurred on the metal gate 32 due to over-polishing while the chemical mechanical polishing process reaches the stop layer. However, by adding an insulating material structure 28 to the metal gate 32, the present invention allows the metal gate 32 not to be a large area by embedding the insulating material structures 28 in the metal gate 32 as a support. Therefore, the over-polishing and the dishing can be avoided.

Moreover, as illustrated in the fabricating steps of FIG. 3, the metal compound layer 14 serving as a stop layer while forming the dummy gate 16'. Therefore, the metal compound layer 14 is disposed under the insulating material structures 28. Because the metal compound layer 14 is a continuous structure disposed under the insulating material structures 28 and the metal gate 32, the electrical current in the metal gate 32 can flow through the metal compound layer 14 when reaching the insulating material structures 28. As a result, the electrical current in the metal gate 32 will not be interrupted by the insulating material structures 28. In this way, the electrical field under the metal gate 32 and the insulating material structures 28 becomes uniform because the metal compound layer 14 can connect the electrical current in the metal gate 32.

Base on different product requirements, the metal gate 32 can be separated into several metal gate pieces which do not connected with each other by locating the insulating material structures 28 in different positions. Under this circumstance, the metal compound layer 14 can still connected current in the metal gate pieces through the continuous structure.

As shown in FIG. 7 and FIG. 8, a high voltage transistor structure 100 includes a substrate 10. A metal gate 32 is disposed on the substrate 10. The metal gate 32 is a continuous structure. At least one insulating material structure 28 penetrates the metal gate 32. The number is of the insulating material structure 28 can one or more than one. There are numerous insulating material structures 28 shown in this embodiment as an example. A metal compound layer 14 is disposed between the metal gate 32 and the substrate 10 and between the insulating material structures 28 and the substrate 10. The metal compound layer 14 is a continuous structure. A gate dielectric layer 12 disposed under the metal compound layer 14 and contacts the substrate 10. The metal compound layer 14 contacts the gate dielectric layer 12, the metal gate 32 and the insulating material structures 28.

The following description shows several types of the insulating material structures 28 with different shapes, but the shape of the insulating material structures 28 is not limited to the types shown in the present invention. Based on different requirements, the insulating material structures can have various designs. As shown in FIG. 7, each of the insulating material structures 28 has a cross section parallel to a direction Y which is a direction of a top surface of the substrate 10. The cross section is a rectangle. Furthermore, as shown in FIG. 9, the cross section parallel to the direction Y is in a shape of a circle. Moreover, as shown in FIG. 10, the cross section parallel to the direction Y is in a shape of a cross.

The numerous insulating material structures 28 may not contact each other as shown in FIG. 7 and FIG. 9. However, as shown in FIG. 10, the numerous insulating material structures 28 can contact and connect with each other.

By using the metal compound layer 14 as a stop layer while forming the dummy gate 16', there is a continuous metal compound layer 14 remains under the metal gate 32 and the insulating material structures 28. The continuous metal compound layer 14 keeps the electric field under the metal gate 32 and the insulating material layer 28 uniform and make the high voltage transistor structure 100 have a more stable efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage transistor structure, comprising:
   a substrate;
   a metal gate disposed on the substrate;
   at least one insulating material structure penetrating the metal gate;
   a metal compound layer disposed between the metal gate and the substrate and between the insulating material structure and the substrate, wherein the metal compound layer is a first continuous structure; and
   a gate dielectric layer disposed under the metal compound layer and contacting the substrate.

2. The high voltage transistor structure of claim 1, wherein the metal compound layer contacts the gate dielectric layer, the metal gate and the insulating material structure.

3. The high voltage transistor structure of claim 1, wherein the metal compound layer comprises metal oxide or metal nitride.

4. The high voltage transistor structure of claim 1, wherein the insulating material structure comprises silicon nitride, silicon oxide, silicon oxide-silicon nitride-silicon oxide (ONO), silicon carbon nitride (SiCN), silicon oxynitride (SiON) or silicon oxycarbonitride (SiOCN).

5. The high voltage transistor structure of claim 1, wherein the insulating material structure has a cross section parallel to a top surface of the substrate, and the cross section comprises a rectangle, a cross or a circle.

6. The high voltage transistor structure of claim 1, further comprising a plurality of the insulating material structures penetrate the metal gate.

7. The high voltage transistor structure of claim 6, wherein the plurality of the insulating material structures do not contact each other.

8. The high voltage transistor structure of claim 6, wherein the plurality of the insulating material structures contact each other.

9. The high voltage transistor structure of claim 1, wherein the metal gate is a second continuous structure.

* * * * *